(12) United States Patent
Byun et al.

(10) Patent No.: US 7,501,344 B2
(45) Date of Patent: *Mar. 10, 2009

(54) FORMATION OF BORIDE BARRIER LAYERS USING CHEMISORPTION TECHNIQUES

(75) Inventors: Jeong Soo Byun, Cupertino, CA (US); Alfred Mak, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/739,549

(22) Filed: Apr. 24, 2007

(65) Prior Publication Data

US 2007/0197028 A1    Aug. 23, 2007

Related U.S. Application Data

(63) Continuation of application No. 10/993,925, filed on Nov. 19, 2004, now Pat. No. 7,208,413, which is a continuation of application No. 10/387,990, filed on Mar. 13, 2003, now Pat. No. 6,831,004, which is a continuation of application No. 09/604,943, filed on Jun. 27, 2000, now Pat. No. 6,620,723.

(51) Int. Cl.
  *H01L 21/44* (2006.01)
(52) U.S. Cl. ............ 438/680; 438/656; 257/E21.168
(58) Field of Classification Search ......... 438/680–681, 438/653, 648, 656; 257/E21.021, E21.168, 257/E21.584; 427/255.38, 255.39, 255.391

See application file for complete search history.

(56) References Cited

U.S. PATENT DOCUMENTS 4,058,430 A    11/1977    Suntola et al.

(Continued)

FOREIGN PATENT DOCUMENTS

DE    2 203 776    8/1973

(Continued)

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001).

(Continued)

*Primary Examiner*—Thanhha Pham
(74) *Attorney, Agent, or Firm*—Patterson & Sheridan, LLP

(57) ABSTRACT

In one embodiment, a method for depositing a boride-containing barrier layer on a substrate is provided which includes exposing the substrate sequentially to a boron-containing compound and a tungsten precursor to form a first boride-containing layer during a first sequential chemisorption process, and exposing the substrate to the boron-containing compound, the tungsten precursor, and ammonia to form a second boride-containing layer over the first boride-containing layer during a second sequential chemisorption process. In one example, the tungsten precursor contains tungsten hexafluoride and the boron-containing compound contains diborane. In another embodiment, a contact layer is deposited over the second boride-containing layer. The contact layer may contain tungsten and be deposited by a chemical vapor deposition process. Alternatively, the contact layer may contain copper and be deposited by a physical vapor deposition process. In other examples, boride-containing layers may be formed at a temperature of less than about 500° C.

21 Claims, 7 Drawing Sheets

U.S. PATENT DOCUMENTS

| | | | |
|---|---|---|---|
| 4,389,973 A | 6/1983 | Suntola et al. |
| 4,413,022 A | 11/1983 | Suntola et al. |
| 4,486,487 A | 12/1984 | Suntola et al. |
| 4,693,208 A | 9/1987 | Sakai |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,976,839 A | 12/1990 | Inoue |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,609 A | 3/1994 | Horike et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi et al. |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,526,244 A | 6/1996 | Bishop |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi et al. |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,942,799 A | 8/1999 | Danek et al. |
| 5,947,710 A | 9/1999 | Cooper et al. |
| 5,972,430 A | 10/1999 | DiMeo, Jr. et al. |
| 6,001,669 A | 12/1999 | Gaines et al. |
| 6,013,553 A | 1/2000 | Wallace et al. |
| 6,015,590 A | 1/2000 | Suntola et al. |
| 6,015,917 A | 1/2000 | Bhandari et al. |
| 6,020,243 A | 2/2000 | Wallace et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,060,755 A | 5/2000 | Ma et al. |
| 6,062,798 A | 5/2000 | Muka |
| 6,071,808 A | 6/2000 | Merchant et al. |
| 6,084,302 A | 7/2000 | Sandhu et al. |
| 6,086,677 A | 7/2000 | Umotoy et al. |
| 6,099,904 A | 8/2000 | Mak et al. |
| 6,110,556 A | 8/2000 | Bang et al. |
| 6,113,977 A | 9/2000 | Soininen et al. |

| | | | | | | |
|---|---|---|---|---|---|---|
| 6,117,244 | A | 9/2000 | Bang et al. | 6,534,395 B2 | 3/2003 | Werkhoven et al. |
| 6,124,158 | A | 9/2000 | Dautartas et al. | 6,534,404 B1 | 3/2003 | Danek et al. |
| 6,130,147 | A | 10/2000 | Major et al. | 6,548,424 B2 | 4/2003 | Putkonen |
| 6,139,700 | A | 10/2000 | Kang et al. | 6,551,929 B1 | 4/2003 | Kori et al. |
| 6,140,237 | A | 10/2000 | Chan et al. | 6,569,501 B2 | 5/2003 | Chiang et al. |
| 6,140,238 | A | 10/2000 | Kitch | 6,585,823 B1 | 7/2003 | Van Wijck |
| 6,143,659 | A | 11/2000 | Leem | 6,593,484 B2 | 7/2003 | Yasuhara et al. |
| 6,144,060 | A | 11/2000 | Park et al. | 6,596,602 B2 | 7/2003 | Iizuka et al. |
| 6,156,382 | A | 12/2000 | Rajagopalan et al. | 6,599,572 B2 | 7/2003 | Saanila et al. |
| 6,158,446 | A | 12/2000 | Mohindra et al. | 6,607,973 B1 | 8/2003 | Jeon |
| 6,162,715 | A | 12/2000 | Mak et al. | 6,607,976 B2 | 8/2003 | Chen et al. |
| 6,174,377 | B1 | 1/2001 | Doering et al. | 6,607,977 B1 | 8/2003 | Rozbicki et al. |
| 6,174,809 | B1 | 1/2001 | Kang et al. | 6,620,723 B1 | 9/2003 | Byun et al. |
| 6,197,683 | B1 | 3/2001 | Kang et al. | 6,627,268 B1 | 9/2003 | Fair et al. |
| 6,200,893 | B1 | 3/2001 | Sneh | 6,630,201 B2 | 10/2003 | Chiang et al. |
| 6,203,613 | B1 | 3/2001 | Gates et al. | 6,632,279 B1 | 10/2003 | Ritala et al. |
| 6,206,967 | B1 | 3/2001 | Mak et al. | 6,635,965 B1 | 10/2003 | Lee et al. |
| 6,207,302 | B1 | 3/2001 | Sugiura et al. | 6,647,138 B1 | 11/2003 | Sakaguchi |
| 6,207,487 | B1 | 3/2001 | Kim et al. | 6,660,126 B2 | 12/2003 | Nguyen et al. |
| 6,218,298 | B1 | 4/2001 | Hoinkis | 6,686,271 B2 | 2/2004 | Raaijmakers et al. |
| 6,238,734 | B1 | 5/2001 | Senzaki et al. | 6,713,373 B1 | 3/2004 | Omstead |
| 6,248,605 | B1 | 6/2001 | Harkonen et al. | 6,713,846 B1 | 3/2004 | Senzaki |
| 6,251,190 | B1 | 6/2001 | Mak et al. | 6,718,126 B2 | 4/2004 | Lei |
| 6,270,572 | B1 | 8/2001 | Kim et al. | 6,720,260 B1 | 4/2004 | Fair et al. |
| 6,271,148 | B1 | 8/2001 | Kao et al. | 6,740,585 B2 | 5/2004 | Yoon et al. |
| 6,274,484 | B1 | 8/2001 | Tsai et al. | 6,764,940 B1 | 7/2004 | Rozbicki et al. |
| 6,284,646 | B1 | 9/2001 | Leem | 6,772,072 B2 | 8/2004 | Ganguli et al. |
| 6,287,965 | B1 | 9/2001 | Kang et al. | 6,777,352 B2 | 8/2004 | Tepman et al. |
| 6,291,283 | B1 | 9/2001 | Wilk | 6,784,096 B2 | 8/2004 | Chen et al. |
| 6,291,876 | B1 | 9/2001 | Stumborg et al. | 6,790,773 B1 | 9/2004 | Drewery et al. |
| 6,297,539 | B1 | 10/2001 | Ma et al. | 6,797,340 B2 | 9/2004 | Fang et al. |
| 6,299,294 | B1 | 10/2001 | Regan | 6,797,642 B1 | 9/2004 | Chu et al. |
| 6,305,314 | B1 | 10/2001 | Sneh et al. | 6,800,173 B2 | 10/2004 | Chiang et al. |
| 6,306,216 | B1 | 10/2001 | Kim et al. | 6,803,272 B1 | 10/2004 | Halliyal et al. |
| 6,309,713 | B1 | 10/2001 | Mak et al. | 6,809,026 B2 | 10/2004 | Yoon et al. |
| 6,316,098 | B1 | 11/2001 | Yitchaik et al. | 6,815,285 B2 | 11/2004 | Choi et al. |
| 6,326,297 | B1 | 12/2001 | Vijayendran | 6,821,563 B2 | 11/2004 | Yudovsky |
| 6,333,260 | B1 | 12/2001 | Kwon et al. | 6,821,889 B2 | 11/2004 | Elers et al. |
| 6,335,280 | B1 | 1/2002 | Van der Jeugd | 6,827,978 B2 | 12/2004 | Yoon et al. |
| 6,342,277 | B1 | 1/2002 | Sherman | 6,831,004 B2 | 12/2004 | Byun et al. |
| 6,348,376 | B2 | 2/2002 | Lim et al. | 6,833,161 B2 | 12/2004 | Wang et al. |
| 6,348,386 | B1 | 2/2002 | Gilmer | 6,838,125 B2 | 1/2005 | Chung et al. |
| 6,355,561 | B1 | 3/2002 | Sandhu et al. | 6,846,516 B2 | 1/2005 | Yang et al. |
| 6,358,829 | B2 | 3/2002 | Yoon et al. | 6,855,368 B1 | 2/2005 | Kori et al. |
| 6,368,954 | B1 | 4/2002 | Lopatin et al. | 6,875,271 B2 | 4/2005 | Glenn et al. |
| 6,369,430 | B1 | 4/2002 | Adetutu et al. | 6,878,402 B2 | 4/2005 | Chiang et al. |
| 6,372,598 | B2 | 4/2002 | Kang et al. | 6,893,915 B2 | 5/2005 | Park et al. |
| 6,379,748 | B1 | 4/2002 | Bhandari et al. | 6,905,541 B2 | 6/2005 | Chen et al. |
| 6,391,785 | B1 | 5/2002 | Satta et al. | 6,915,592 B2 | 7/2005 | Guenther |
| 6,391,803 | B1 | 5/2002 | Kim et al. | 6,932,871 B2 | 8/2005 | Chang et al. |
| 6,395,650 | B1 | 5/2002 | Callegari et al. | 6,936,538 B2 | 8/2005 | Byun |
| 6,399,208 | B1 | 6/2002 | Baum et al. | 6,939,804 B2 | 9/2005 | Lai et al. |
| 6,399,491 | B2 | 6/2002 | Jeon et al. | 6,951,804 B2 | 10/2005 | Seutter et al. |
| 6,416,577 | B1 | 7/2002 | Suntoloa et al. | 6,955,211 B2 | 10/2005 | Ku et al. |
| 6,416,822 | B1 | 7/2002 | Chiang et al. | 6,958,174 B1 | 10/2005 | Klaus et al. |
| 6,420,189 | B1 | 7/2002 | Lopatin et al. | 6,969,539 B2 | 11/2005 | Gordon et al. |
| 6,420,279 | B1 | 7/2002 | Ono et al. | 6,998,014 B2 | 2/2006 | Chen et al. |
| 6,423,619 | B1 | 7/2002 | Grant et al. | 7,005,372 B2 | 2/2006 | Levy et al. |
| 6,428,859 | B1 | 8/2002 | Chiang et al. | 7,026,238 B2 | 4/2006 | Xi et al. |
| 6,447,933 | B1 | 9/2002 | Wang et al. | 7,033,922 B2 | 4/2006 | Kori et al. |
| 6,451,119 | B2 | 9/2002 | Sneh et al. | 7,094,680 B2 | 8/2006 | Seutter et al. |
| 6,451,695 | B2 | 9/2002 | Sneh | 7,101,795 B1 | 9/2006 | Xi et al. |
| 6,452,229 | B1 | 9/2002 | Krivokapic | 7,115,494 B2 | 10/2006 | Sinha et al. |
| 6,458,701 | B1 | 10/2002 | Chae et al. | 7,115,499 B2 | 10/2006 | Wang et al. |
| 6,468,924 | B2 | 10/2002 | Lee et al. | 7,141,494 B2 | 11/2006 | Lee et al. |
| 6,475,276 | B1 | 11/2002 | Elers et al. | 7,186,385 B2 | 3/2007 | Ganguli et al. |
| 6,475,910 | B1 | 11/2002 | Sneh | 7,208,413 B2 | 4/2007 | Byun et al. |
| 6,478,872 | B1 | 11/2002 | Chae et al. | 7,211,144 B2 | 5/2007 | Lu et al. |
| 6,482,262 | B1 | 11/2002 | Elers et al. | 7,211,508 B2 | 5/2007 | Chung et al. |
| 6,482,733 | B2 | 11/2002 | Raaijmakers et al. | 7,220,673 B2 | 5/2007 | Xi et al. |
| 6,482,740 | B2 | 11/2002 | Soininen et al. | 2001/0000866 A1 | 5/2001 | Sneh et al. |
| 6,511,539 | B1 | 1/2003 | Raaijmakers | 2001/0002280 A1 | 5/2001 | Sneh |
| 6,524,952 | B1 | 2/2003 | Srinivas et al. | 2001/0009140 A1 | 7/2001 | Bondestam et al. |

| | | |
|---|---|---|
| 2001/0009695 A1 | 7/2001 | Saanila et al. |
| 2001/0011526 A1 | 8/2001 | Doering et al. |
| 2001/0021589 A1 | 9/2001 | Wilk |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0029092 A1 | 10/2001 | Park et al. |
| 2001/0029094 A1 | 10/2001 | Mee-Young et al. |
| 2001/0029891 A1 | 10/2001 | Oh et al. |
| 2001/0031562 A1 | 10/2001 | Raaijmakers et al. |
| 2001/0034123 A1 | 10/2001 | Jeon et al. |
| 2001/0041250 A1 | 11/2001 | Werkhoven et al. |
| 2001/0042799 A1 | 11/2001 | Kim et al. |
| 2001/0050039 A1 | 12/2001 | Park et al. |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0004293 A1 | 1/2002 | Soininen et al. |
| 2002/0005556 A1 | 1/2002 | Cartier et al. |
| 2002/0007790 A1 | 1/2002 | Park |
| 2002/0008297 A1 | 1/2002 | Park et al. |
| 2002/0009544 A1 | 1/2002 | McFeely et al. |
| 2002/0014647 A1 | 2/2002 | Seidl et al. |
| 2002/0015790 A1 | 2/2002 | Baum et al. |
| 2002/0019121 A1 | 2/2002 | Pyo |
| 2002/0020869 A1 | 2/2002 | Park et al. |
| 2002/0021544 A1 | 2/2002 | Cho et al. |
| 2002/0029092 A1 | 3/2002 | Gass |
| 2002/0031618 A1 | 3/2002 | Sherman |
| 2002/0037630 A1 | 3/2002 | Agarwal et al. |
| 2002/0041931 A1 | 4/2002 | Suntola et al. |
| 2002/0043666 A1 | 4/2002 | Parsons et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0064970 A1 | 5/2002 | Chooi et al. |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0093046 A1 | 7/2002 | Moriya et al. |
| 2002/0093781 A1 | 7/2002 | Bachhofer et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0105088 A1 | 8/2002 | Yang et al. |
| 2002/0106536 A1 | 8/2002 | Lee et al. |
| 2002/0106846 A1 | 8/2002 | Seutter et al. |
| 2002/0109168 A1 | 8/2002 | Kim et al. |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0146895 A1 | 10/2002 | Ramdani et al. |
| 2002/0151152 A1 | 10/2002 | Simamoto et al. |
| 2002/0153579 A1 | 10/2002 | Yamamoto et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0172768 A1 | 11/2002 | Endo et al. |
| 2002/0175393 A1 | 11/2002 | Baum et al. |
| 2002/0177282 A1 | 11/2002 | Song |
| 2002/0177399 A1 | 11/2002 | Brown |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0195643 A1 | 12/2002 | Harada |
| 2002/0197402 A1 | 12/2002 | Chiang et al. |
| 2002/0197863 A1 | 12/2002 | Mak et al. |
| 2002/0197881 A1 | 12/2002 | Ramdani et al. |
| 2003/0013300 A1 | 1/2003 | Byun |
| 2003/0013320 A1 | 1/2003 | Kim et al. |
| 2003/0017697 A1 | 1/2003 | Choi et al. |
| 2003/0022487 A1 | 1/2003 | Yoon et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0068437 A1 | 4/2003 | Nakamura et al. |
| 2003/0072884 A1 | 4/2003 | Zhang et al. |
| 2003/0072975 A1 | 4/2003 | Shero et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0089308 A1 | 5/2003 | Raaijmakers et al. |
| 2003/0089942 A1 | 5/2003 | Bhattacharyya |
| 2003/0096473 A1 | 5/2003 | Shih et al. |
| 2003/0101927 A1 | 6/2003 | Raaijmakers |
| 2003/0104126 A1 | 6/2003 | Fang et al. |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0113187 A1 | 6/2003 | Lei et al. |
| 2003/0116087 A1 | 6/2003 | Nguyen et al. |
| 2003/0116804 A1 | 6/2003 | Visokay et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0127043 A1 | 7/2003 | Lu et al. |
| 2003/0129826 A1 | 7/2003 | Werkhoven et al. |
| 2003/0133861 A1 | 7/2003 | Bowen et al. |
| 2003/0134508 A1 | 7/2003 | Raaijamakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153177 A1 | 8/2003 | Tepman et al. |
| 2003/0153181 A1 | 8/2003 | Yoon et al. |
| 2003/0157760 A1 | 8/2003 | Xi et al. |
| 2003/0160277 A1 | 8/2003 | Bhattacharyya |
| 2003/0161952 A1 | 8/2003 | Wang et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0181035 A1 | 9/2003 | Yoon et al. |
| 2003/0185980 A1 | 10/2003 | Endo |
| 2003/0186495 A1 | 10/2003 | Saanila et al. |
| 2003/0188682 A1 | 10/2003 | Tois et al. |

| | | | | | | |
|---|---|---|---|---|---|---|
| 2003/0190423 A1 | 10/2003 | Yang et al. | | 2005/0009325 A1 | 1/2005 | Chung et al. |
| 2003/0190497 A1 | 10/2003 | Yang et al. | | 2005/0031786 A1 | 2/2005 | Lee et al. |
| 2003/0190804 A1 | 10/2003 | Glenn et al. | | 2005/0059240 A1 | 3/2005 | Choi et al. |
| 2003/0194493 A1 | 10/2003 | Chang et al. | | 2005/0059241 A1 | 3/2005 | Kori et al. |
| 2003/0194825 A1 | 10/2003 | Law et al. | | 2005/0064098 A1 | 3/2005 | Elers et al. |
| 2003/0194853 A1 | 10/2003 | Jeon | | 2005/0064207 A1 | 3/2005 | Senzaki et al. |
| 2003/0194858 A1 | 10/2003 | Lee et al. | | 2005/0070126 A1 | 3/2005 | Senzaki |
| 2003/0203616 A1 | 10/2003 | Chang et al. | | 2005/0104142 A1 | 5/2005 | Narayanan et al. |
| 2003/0205729 A1 | 11/2003 | Basceri et al. | | 2005/0118804 A1 | 6/2005 | Byun et al. |
| 2003/0213987 A1 | 11/2003 | Basceri et al. | | 2005/0153571 A1 | 7/2005 | Senzaki |
| 2003/0219942 A1 | 11/2003 | Choi et al. | | 2005/0164487 A1 | 7/2005 | Seutter et al. |
| 2003/0224217 A1 | 12/2003 | Byun et al. | | 2005/0176240 A1 | 8/2005 | Wang et al. |
| 2003/0224578 A1 | 12/2003 | Chung et al. | | 2005/0189072 A1 | 9/2005 | Chen et al. |
| 2003/0224600 A1 | 12/2003 | Cao et al. | | 2005/0208763 A1 | 9/2005 | Byun |
| 2003/0227033 A1 | 12/2003 | Ahn et al. | | 2005/0233156 A1 | 10/2005 | Senzaki et al. |
| 2003/0232497 A1 | 12/2003 | Xi et al. | | 2005/0255243 A1 | 11/2005 | Senzaki |
| 2003/0232501 A1 | 12/2003 | Kher et al. | | 2005/0257735 A1 | 11/2005 | Guenther |
| 2003/0232506 A1 | 12/2003 | Metzner et al. | | 2005/0271814 A1 | 12/2005 | Chang et al. |
| 2003/0232511 A1 | 12/2003 | Metzner et al. | | 2005/0287807 A1 | 12/2005 | Lai et al. |
| 2003/0234417 A1 | 12/2003 | Raaijmakers et al. | | 2006/0009034 A1 | 1/2006 | Lai et al. |
| 2003/0235961 A1 | 12/2003 | Metzner et al. | | 2006/0030148 A1 | 2/2006 | Seutter et al. |
| 2004/0005749 A1 | 1/2004 | Choi et al. | | 2006/0040052 A1 | 2/2006 | Fang et al. |
| 2004/0007747 A1 | 1/2004 | Visokay et al. | | 2006/0075966 A1 | 4/2006 | Chen et al. |
| 2004/0009307 A1 | 1/2004 | Koh et al. | | 2006/0128132 A1 | 6/2006 | Sinha et al. |
| 2004/0009675 A1 | 1/2004 | Eissa et al. | | 2006/0128150 A1 | 6/2006 | Gandikota et al. |
| 2004/0011504 A1 | 1/2004 | Ku et al. | | 2006/0156979 A1 | 7/2006 | Thakur et al. |
| 2004/0013577 A1 | 1/2004 | Ganguli et al. | | 2006/0199372 A1 | 9/2006 | Chung et al. |
| 2004/0013803 A1 | 1/2004 | Chung et al. | | 2006/0257295 A1 | 11/2006 | Chen et al. |
| 2004/0014315 A1 | 1/2004 | Lai et al. | | 2006/0264031 A1 | 11/2006 | Xi et al. |
| 2004/0014320 A1 | 1/2004 | Chen et al. | | 2006/0276020 A1 | 12/2006 | Yoon et al. |
| 2004/0015300 A1 | 1/2004 | Ganguli et al. | | 2006/0292874 A1 | 12/2006 | Kori et al. |
| 2004/0016973 A1 | 1/2004 | Rotondaro et al. | | 2007/0003698 A1 | 1/2007 | Chen et al. |
| 2004/0018304 A1 | 1/2004 | Chung et al. | | 2007/0009658 A1 | 1/2007 | Yoo et al. |
| 2004/0018723 A1 | 1/2004 | Byun et al. | | 2007/0020890 A1 | 1/2007 | Thakur et al. |
| 2004/0018747 A1 | 1/2004 | Lee et al. | | 2007/0020924 A1 | 1/2007 | Wang et al. |
| 2004/0023461 A1 | 2/2004 | Ahn et al. | | 2007/0026147 A1 | 2/2007 | Chen et al. |
| 2004/0023462 A1 | 2/2004 | Rotondaro et al. | | 2007/0067609 A1 | 3/2007 | Chen et al. |
| 2004/0025370 A1 | 2/2004 | Guenther | | 2007/0099415 A1 | 5/2007 | Chen et al. |
| 2004/0028952 A1 | 2/2004 | Cartier et al. | | 2007/0119370 A1 | 5/2007 | Ma et al. |
| 2004/0029321 A1 | 2/2004 | Ang et al. | | 2007/0119371 A1 | 5/2007 | Ma et al. |
| 2004/0033698 A1 | 2/2004 | Lee et al. | | 2007/0128862 A1 | 6/2007 | Ma et al. |
| 2004/0036111 A1 | 2/2004 | Nishikawa et al. | | 2007/0128863 A1 | 6/2007 | Ma et al. |
| 2004/0038554 A1 | 2/2004 | Ahn et al. | | 2007/0128864 A1 | 6/2007 | Ma et al. |
| 2004/0040501 A1 | 3/2004 | Vaartstra | | 2007/0197027 A1 * | 8/2007 | Byun et al. ............... 438/656 |
| 2004/0041320 A1 | 3/2004 | Hodumi | | | | |
| 2004/0043149 A1 | 3/2004 | Gordon et al. | | | FOREIGN PATENT DOCUMENTS | |
| 2004/0043569 A1 | 3/2004 | Ahn et al. | | | | |
| 2004/0043630 A1 | 3/2004 | Vaarstra et al. | | DE | 196 27 017 | 7/1995 |
| 2004/0046197 A1 | 3/2004 | Basceri et al. | | DE | 198 20 147 | 12/1997 |
| 2004/0048491 A1 | 3/2004 | Jung et al. | | EP | 0 344 352 | 12/1989 |
| 2004/0051152 A1 | 3/2004 | Nakajima | | EP | 0 429 270 | 5/1991 |
| 2004/0053484 A1 | 3/2004 | Kumar et al. | | EP | 0 442 290 | 8/1991 |
| 2004/0065255 A1 | 4/2004 | Yang et al. | | EP | 0 442 490 | 8/1991 |
| 2004/0067641 A1 | 4/2004 | Yudovsky | | EP | 0 464 515 | 1/1992 |
| 2004/0077182 A1 | 4/2004 | Lim et al. | | EP | 0 799 641 | 10/1997 |
| 2004/0077183 A1 | 4/2004 | Chung et al. | | EP | 0 973 189 | 1/2000 |
| 2004/0078723 A1 | 4/2004 | Gross et al. | | EP | 0 973 191 | 1/2000 |
| 2004/0170403 A1 | 9/2004 | Lei | | EP | 1 146 141 | 10/2001 |
| 2004/0187304 A1 | 9/2004 | Chen et al. | | EP | 1 167 569 | 1/2002 |
| 2004/0202786 A1 | 10/2004 | Wongsenakhum et al. | | EP | 1 170 804 | 1/2002 |
| 2004/0203254 A1 | 10/2004 | Conley, Jr. et al. | | EP | 1 321 973 | 6/2003 |
| 2004/0209460 A1 | 10/2004 | Xi et al. | | FR | 2 626 110 | 7/1989 |
| 2004/0209465 A1 | 10/2004 | Xi et al. | | FR | 2 692 597 | 12/1993 |
| 2004/0211665 A1 | 10/2004 | Yoon et al. | | GB | 2 355 727 | 5/2001 |
| 2004/0214354 A1 | 10/2004 | Conley, Jr. et al. | | JP | 58-098917 | 6/1983 |
| 2004/0216670 A1 | 11/2004 | Gutsche et al. | | JP | 58-100419 | 6/1983 |
| 2004/0219784 A1 | 11/2004 | Kang et al. | | JP | 60-065712 A | 4/1985 |
| 2004/0224506 A1 | 11/2004 | Choi et al. | | JP | 61-035847 | 2/1986 |
| 2004/0235285 A1 | 11/2004 | Kang et al. | | JP | 61-210623 | 9/1986 |
| 2004/0247788 A1 | 12/2004 | Fang et al. | | JP | 62-069508 | 3/1987 |
| 2004/0256351 A1 | 12/2004 | Chung et al. | | JP | 62-091495 | 4/1987 |
| 2005/0006799 A1 | 1/2005 | Brock et al. | | JP | 62-141717 | 6/1987 |
| 2005/0008779 A1 | 1/2005 | Yang et al. | | JP | 62-167297 | 7/1987 |

| | | | | | |
|---|---|---|---|---|---|
| JP | 62-171999 | 7/1987 | JP | 04-132681 | 5/1992 |
| JP | 62-232919 | 10/1987 | JP | 04-151822 | 5/1992 |
| JP | 63-062313 | 3/1988 | JP | 04-162418 | 6/1992 |
| JP | 63-085098 | 4/1988 | JP | 04-175299 | 6/1992 |
| JP | 63-090833 | 4/1988 | JP | 04-186824 | 7/1992 |
| JP | 63-222420 | 9/1988 | JP | 04-212411 | 8/1992 |
| JP | 63-222421 | 9/1988 | JP | 04-260696 | 9/1992 |
| JP | 63-227007 | 9/1988 | JP | 04-273120 | 9/1992 |
| JP | 63-252420 | 10/1988 | JP | 04-285167 | 10/1992 |
| JP | 63-266814 | 11/1988 | JP | 04-291916 | 10/1992 |
| JP | 64 009895 | 1/1989 | JP | 04-325500 | 11/1992 |
| JP | 64-009896 | 1/1989 | JP | 04-328874 | 11/1992 |
| JP | 64-009897 | 1/1989 | JP | 05-029228 | 2/1993 |
| JP | 64-037832 | 2/1989 | JP | 05-047665 | 2/1993 |
| JP | 01-62244 | 3/1989 | JP | 05-047666 | 2/1993 |
| JP | 64-082615 | 3/1989 | JP | 05-047668 | 2/1993 |
| JP | 64-082617 | 3/1989 | JP | 05-074717 | 3/1993 |
| JP | 64-082671 | 3/1989 | JP | 05-074724 | 3/1993 |
| JP | 64-082676 | 3/1989 | JP | 05-102189 | 4/1993 |
| JP | 01 103982 | 4/1989 | JP | 05-160152 | 6/1993 |
| JP | 01-103996 | 4/1989 | JP | 05-175143 | 7/1993 |
| JP | 64-090524 | 4/1989 | JP | 05-175145 | 7/1993 |
| JP | 01-117017 | 5/1989 | JP | 05-182906 | 7/1993 |
| JP | 01-143221 | 6/1989 | JP | 05-186295 | 7/1993 |
| JP | 01-143233 | 6/1989 | JP | 05-206036 | 8/1993 |
| JP | 01-154511 | 6/1989 | JP | 05-234899 | 9/1993 |
| JP | 01-236657 | 9/1989 | JP | 05-235047 | 9/1993 |
| JP | 2001-245512 | 9/1989 | JP | 05-251339 | 9/1993 |
| JP | 01-264218 | 10/1989 | JP | 05-270997 | 10/1993 |
| JP | 01-270593 | 10/1989 | JP | 05-283336 | 10/1993 |
| JP | 01-272108 | 10/1989 | JP | 05-291152 | 11/1993 |
| JP | 2001-303251 | 10/1989 | JP | 05-304334 | 11/1993 |
| JP | 01-290221 | 11/1989 | JP | 05-343327 | 12/1993 |
| JP | 01-290222 | 11/1989 | JP | 05-343685 | 12/1993 |
| JP | 01-296673 | 11/1989 | JP | 06-045606 | 2/1994 |
| JP | 01-303770 | 12/1989 | JP | 06-132236 | 5/1994 |
| JP | 01-305894 | 12/1989 | JP | 06-177381 | 6/1994 |
| JP | 01-313927 | 12/1989 | JP | 06-196809 | 7/1994 |
| JP | 02-012814 | 1/1990 | JP | 06-222388 | 8/1994 |
| JP | 02-014513 | 1/1990 | JP | 06-224138 | 8/1994 |
| JP | 02-017634 | 1/1990 | JP | 06-230421 | 8/1994 |
| JP | 02-063115 | 3/1990 | JP | 06-252057 | 9/1994 |
| JP | 02-074029 | 3/1990 | JP | 06-291048 | 10/1994 |
| JP | 02-074587 | 3/1990 | JP | 07-070752 | 3/1995 |
| JP | 02-106822 | 4/1990 | JP | 07-086269 | 3/1995 |
| JP | 02-129913 | 5/1990 | JP | 07-300649 | 11/1995 |
| JP | 02-162717 | 6/1990 | JP | 08-181076 | 7/1996 |
| JP | 02-172895 | 7/1990 | JP | 08-245291 | 9/1996 |
| JP | 02-196092 | 8/1990 | JP | 08-264530 | 10/1996 |
| JP | 02-203517 | 8/1990 | JP | 09-260786 | 10/1997 |
| JP | 02-230690 | 9/1990 | JP | 09-293681 | 11/1997 |
| JP | 02-230722 | 9/1990 | JP | 10-188840 | 7/1998 |
| JP | 02-246161 | 10/1990 | JP | 10-190128 | 7/1998 |
| JP | 02-264491 | 10/1990 | JP | 10-308283 | 11/1998 |
| JP | 02-283084 | 11/1990 | JP | 11-269652 | 10/1999 |
| JP | 02-304916 | 12/1990 | JP | 2000-031387 | 1/2000 |
| JP | 03-019211 | 1/1991 | JP | 2000-058777 | 2/2000 |
| JP | 03-022569 | 1/1991 | JP | 2000-068072 | 3/2000 |
| JP | 03-023294 | 1/1991 | JP | 2000-087029 | 3/2000 |
| JP | 03-023299 | 1/1991 | JP | 2000-138094 | 5/2000 |
| JP | 03-044967 | 2/1991 | JP | 00-178735 | 6/2000 |
| JP | 03-048421 | 3/1991 | JP | 2000-218445 | 8/2000 |
| JP | 03-070124 | 3/1991 | JP | 2000-319772 | 11/2000 |
| JP | 03-185716 | 8/1991 | JP | 2000-340883 | 12/2000 |
| JP | 03-208885 | 9/1991 | JP | 2000-353666 | 12/2000 |
| JP | 03-234025 | 10/1991 | JP | 2001-020075 | 1/2001 |
| JP | 03-286522 | 12/1991 | JP | 2001-111000 A | 4/2001 |
| JP | 03-286531 | 12/1991 | JP | 2001-152339 | 6/2001 |
| JP | 04-031391 | 2/1992 | JP | 2001-172767 A | 6/2001 |
| JP | 04-031396 | 2/1992 | JP | 2001-189312 | 7/2001 |
| JP | 04-100292 | 4/1992 | JP | 2001-217206 | 8/2001 |
| JP | 04-111418 | 4/1992 | JP | 2001-220287 | 8/2001 |
| JP | 04-132214 | 5/1992 | JP | 2001-220294 | 8/2001 |

| | | |
|---|---|---|
| JP | 01-254181 | 9/2001 |
| JP | 2001-240972 | 9/2001 |
| JP | 2001-284042 | 10/2001 |
| JP | 2001-328900 | 11/2001 |
| JP | 2002-060944 A | 2/2002 |
| JP | 2002-69641 A | 3/2002 |
| JP | 2002-93804 A | 3/2002 |
| JP | 2002-167672 A | 6/2002 |
| JP | 2002-172767 A | 6/2002 |
| WO | WO 90/02216 | 3/1990 |
| WO | WO 91/10510 | 7/1991 |
| WO | WO 93/02111 | 2/1993 |
| WO | WO 96/17107 | 6/1996 |
| WO | WO 96/18756 | 6/1996 |
| WO | WO 98/06889 | 2/1998 |
| WO | WO 98/51838 | 11/1998 |
| WO | WO 99/01595 | 1/1999 |
| WO | WO 99/13504 | 3/1999 |
| WO | WO 99/29924 | 6/1999 |
| WO | WO 99/41423 | 8/1999 |
| WO | WO 99/65064 | 12/1999 |
| WO | WO 00/11721 | 3/2000 |
| WO | WO 00/13235 | 3/2000 |
| WO | WO 00/15865 | 3/2000 |
| WO | WO 00/15881 | 3/2000 |
| WO | WO 00/16377 | 3/2000 |
| WO | WO 00/54320 | 9/2000 |
| WO | WO 00/63957 | 10/2000 |
| WO | WO 00/70674 | 11/2000 |
| WO | WO 00/79019 | 12/2000 |
| WO | WO 00/79576 | 12/2000 |
| WO | WO 01/15220 | 3/2001 |
| WO | WO 01/17692 | 3/2001 |
| WO | WO 01/25502 | 4/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 01/82390 | 11/2001 |
| WO | WO 01/99166 | 12/2001 |
| WO | WO 02/01628 | 1/2002 |
| WO | WO 02/08485 | 1/2002 |
| WO | WO 02/09167 | 1/2002 |
| WO | WO 02/27063 | 4/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO 02/067319 | 8/2002 |
| WO | WO 2004/106584 | 12/2004 |
| WO | WO 2005/027211 | 3/2005 |

OTHER PUBLICATIONS

Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS: ISM), SEMICON Korea 2006, Semiconductor Equipment and Materials International, pp. 1-6.

Bader, et al. "Integrated Processing Equipment," Solid State Technology, Cowan Pub., vol. 33, No. 5 (May 1, 1990), pp. 149-154.

Balog, et al. "Chemical Vapor Deposition and Characterization of $HfO_2$ Films from Organo-Hafnium Compounds," Thin Solid Films, 41 (1977) pp. 247-259.

Bedair "Atomic layer epitaxy deposition processes," J. Vac. Sci. Techol. 12(1) (Jan./Feb. 1994).

Cameron, et al. "Atomic Layer Deposition of $SiO_2$ and $TiO_2$ in Alumina Tubular Membranes: Pore Reduction and Effect of Surface Species on Gas Transport," Langmuir, vol. 16, No. 19, American Chemical Society, 2000, pp. 7435-7444.

Chatham, et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorganic Chemistry 1999, 38, pp. 2238-2239.

Choi, et al. "Stability of $TiB_2$ as a Diffusion Barrier on Silicon", J. Electrochem. Soc. 138(10) (Oct. 1991), pp. 3062-3067.

Choi, et al. "The Effect of Annealing on Resistivity of Low Pressure Chemical Vapor Deposited Titanium Diboride," Journal of Applied Physics, Jun. 1, 1991, pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, et al. "Interval Annealing During Alternating Pulse Deposition," Mat. Res. Soc. Symp. Proc., vol. 811, Apr. 12-16, 2004, D1.3.1.

Derbyshire, K. "Applications of Integrated processing," Solid State Technology, US, Cowan Pub., vol. 37, No. 12 (Dec. 1, 1994), pp. 45-47.

Dey, et al. "Ruthenium films by digital chemical vapor deposition: Selectivity, nanostructure, and function," Applied Physics Letter, vol. 84, No. 9, Mar. 1, 2004, American Institute of Physics, pp. 1606.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01 EX461) 2001.

Elam, et al. "Nucleation and Growth During Tungsten Atomic Layer Deposition on $SiO_2$ Surfaces," Thin Solid Films, 386, (2001), pp. 41-52.

Elers, et al. "$NbCl_5$ as a precursor in atomic layer epitaxy," Appl. Surf. Sci., vol. 82/83 (1994), pp. 468-474.

George, et al. "Atomic layer controlled deposition of $SiO_2$ and $Al_2O_3$ using ABAB . . . binary reaction sequence chemistry," Appl. Surf. Sci., vol. 82/83 (1994), pp. 460-467.

George, et al. "Surface Chemistry for Atomic Layer Growth," J. Phys. Chem. 1996, 100, 13121-13131.

Goswami, et al. "Transition Metals Show Promise as Copper Barriers," Semiconductor International, ATMI, San Jose—May 1, 2004, Semiconductor International, pp. 1-7.

Goto, et al. "Atomic layer controlled deposition of silicon nitride with self-limiting mechanism," Applied Physics Letters, American Institute of Physics, New York, US, vol. 68, No. 23, Jun. 3, 1996, pp. 3257-3259.

He, et al. "Pulse Deposition of Silicate Films," Journal of Applied Physics, vol. 94, No. 5, Sep. 1, 2003, pp. 3657-3659.

Hendrix, et al. "Composition Control of $Hf_{1-x}Si_xO_2$ Films Deposited on Si by Chemical-vapor Deposition Using Amide Precursors," Applied Physics Letters, American Institute of Physics, New York, US, vol. 80, No. 13, Apr. 1, 2002, pp. 2362-2364.

Ho, et al. "Suppressed crystallization of Hf-based gate dielectrics by controlled addition of $Al_2O_3$ using atomic layer deposition," Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization," Interconnect Technology Conference, 2004, Proceedings of the IEEE 2004 International, Jun. 7-9, 2004, pp. 9-11.

Hultman, et al. "Review of the thermal and mechanical stability of TiN-based thin films", Zeitschrift Fur Metalkunde, 90 (10) (Oct. 1999), pp. 803-813.

Hwang, et al. "Nanometer-size $\alpha$-$PbO_2$-type $TiO_2$ in Garnet: A Thermobarometer for Ultrahigh-Pressure Metamorphism," Science vol. 288 (Apr. 14, 2000), pp. 321-324.

IBM Tech. Disc. Bull. "Knowledge-Based Dynamic Scheduler in Distributed Computer Control," (Jun. 1990), pp. 80-84.

IBM Tech. Disc. Bull. "Multiprocessor and Multitasking Architecture for Tool Control of the Advanced via Inspection Tools," (May 1992), pp. 190-191.

Kamiyama, et al. "Improvement in the uniformity and the thermal stability of Hf-silicate gate dielectric by plasma-nitridation," Gate Insulator, 2003, IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using $HfCl_2$ [$N(SiMe_3]_2)_2$ and $H_2O$," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) pp. 511-516.

Kawahara, et al. "Effects of Hf Sources, Oxidizing Agents, and $NH_3$ radicals on properties of $NfAlO_x$ films prepared by atomic layer deposition," IWGI 2003, Tokyo, Nov. 6, 2003, pp. 32-37.

Kim, et al. "Atomic Layer Deposition of Low Resistivity and High-Density Tungsten Nitride Thin Film Using $B_2H_6$, $WF_5$ and $NH_3$," Electrochem. Solid-State Lett., vol. 9, Issue 3, (2006), pp. C54-C57.

Kitigawa, et al. "Hydrogen-mediated low temperature epitaxy of Si in plasma-enhanced chemical vapor deposition," Applied Surface Science (2000), pp. 30-34.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) pp. 435-448.

Klaus, et al. "Atomic Layer Deposition of Tungsten using Sequential Surface Chemistry with a Sacrificial Stripping Reaction," Thin Solid Films 360 (2000), pp. 145-153. (Accepted Nov. 16, 1999).

Klaus, et al. "Atomically Controlled Growth of Tungsten and Tungsten Nitride Using Sequential Surface Reactions," Applied Surface Science, 162-163 (2000) pp. 479-491.

Kukli, et al. "Atomic Layer Deposition of Hafnium Dioxide Films from Hafnium Tetrakis(ethylmethylamide) and Water," Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from $Ta(OC_2H_5)$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; pp. 300-306.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee "The Preparation of Titanium-Based Thin Film by CVD Using Titanium Chlorides as Precursors", Chemical Vapor Deposition 5(2) Mar. 1999, pp. 69-73.

Lee, et al. "Pulsed Nucleation for Ultra-High Aspect Ratio Tungsten Plugfill," Materials Research Society, 2002, pp. 649-653.

Martensson, et al. "Atomic Layer Epitaxy of Copper, Growth & Selectivity in the Cu (II)-2,2.6,6-Tetramethyl-3, 5-Heptanedion ATE/$H_2$ Process", J. Electrochem. Soc., 145(8) (Aug. 1998), pp. 2926-2931.

Martensson, et al. "Use of Atomic Layer Epitaxy for Fabrication of Si/TiN/Cu Structures", J. Vac. Sci. & Tech. B, vol. 17, No. 5, (Sep. 1999), pp. 2122-2128.

Martensson, et al. "Atomic Layer Epitaxy of Copper on Tantalum," Chemical Vapor Deposition, 3(1) (Feb. 1, 1997), pp. 45-50.

Maydan "Cluster Tools for Fabrication of Advanced devices," Jap. J. of Applied Physics, Extended Abstracts, 22nd Conference Solid State Devices and Materials (1990), pp. 849-852, XP000178141.

McGeachin "Synthesis and properties of some β-diketimines derived from acetylacetone, and their metal complexes," Canadian J. of Chemistry, vol. 46 (1968), pp. 1903-1912.

Min, et al. "Atomic Layer Deposition of TiN Thin Films by Sequential Introduction of Ti Precursor and $NH_3$," Mat. Res. Soc. Sm. Proc. vol. 514 (1998), pp. 337-342.

Min, et al. "Chemical Vapor Deposition of Ti-Si-N Films With Alternating Source Supply," Mat. Rec. Soc. Symp. Proc. Vol. (1999), pp. 207-210.

Min, et al. "Metal-organic Atomic-layer Deposition of Titanium-silicon-nitride films," Applied Physics Letters, vol. 75, No. 11 (Sep. 13, 1999), pp. 1521-1523.

Niinisto, et al. "Synthesis of Oxide Thin Films and Overlayers by Atomic Layer Epitaxy for Advanced Applications," Materials Science and Engineering B41 (1996), pp. 23-29.

Ohba, et al. "Thermal Decomposition of Methylhydrazine and Deposition Properties of CVD TiN Thin Films," Conference Proceedings, Advanced Metallization for ULSI Applications in 1993 (1994), pp. 143-149.

Ohshita, et al. "$Hf_{1-x}Si_xO_2$ deposition by metal organic chemical vapor deposition using the $Nf(NEt_2)_4/SiH(NEt_2)_3/O_2$ gas system," Preparation and Characterization, Elsevier Sequioa, NL, vol. 416, No. 1-2, Sep. 2, 2002, pp. 208-211.

Oshita, et al. "$HfO_2$ Growth by Low-Pressure Chemical Vapor Deposition Using the $Hf(N(C_2H_5)_2)_4/O_2$ Gas System," Journal of Crystal Growth 233 (2001) pp. 292-297.

Park, et al. "Performance improvement of MOSFET with $HfO_2$-$Al_2$-3 laminate gate dielectric and CVD-TaN metal gate deposited by TAIMATA," Electron Devices Meeting, 2003, IEDM '03 Technical Digest. IEEE International Dec. 8-10, 2003, pp. 13.6.1-13.6.4.

PCT International Search Report dated Feb. 14, 2002 for International Application No. PCT/US01/20310.

Proceedings of the ICEEE 1998 International Technology Conference—San Francisco, California, Jun. 1-3, 1998.

Ritala, et al. "Ann. Acad. Sci. Fenn. Ser. A II.," Chemica 257 (1994), pp. 1-48.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_4$," J. Electrochem. Soc., vol. 145, No. 8, (Aug. 1998) pp. 2914-2920.

Ritala, et al. "Atomic Layer Epitaxy Growth of TiN Thin Films", J. Electrochem. Soc., vol. 142, No. 8, Aug. 1995, pp. 2731-2737.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), pp. 72-80.

Ritala, et al. "Effects of Intermediate Zinc Pulses on Properties on TiN and NbN Films by Atomic Layer Epitaxy," Applied Surface Science, vol. 120, No. 3-4, Dec. 1997, pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chem. Vap. Deposition 1999, 5, No. 1, pp. 7-9.

Ritala, et al. "Surface Roughness Reduction in Atomic Layer Epitaxy Growth of Titanium Dioxide Thin Films," Thin Solid-Films, vol. 249, No.2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Scheper, et al. "Low-temperature deposition of titanium nitride films from dialkylhydrazine-based precursors," Materials Science in Semiconductor Processing 2 (1999), pp. 149-157.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films," Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003) pp. 91-98.

Sneh, et al. "Atomic Layer Deposition of $SiO_2$ Using Catalyzed and Uncatalyzed Self-Limiting Surface Reactions," Surface Review and Letters, vol. 6, Nos. 3 & 4 (1999) pp. 435-448.

Solanki, et al. "Atomic Layer deposition of Copper Seed Layers," Electrochemical and Solid State Letters 3(10) (2000), pp. 479-480.

Suzuki, et al. "A 0.2-μm contact filing by 450° C-hydrazine-reduced TiN film with low Resistivity," IEDM 92-979, pp. 11.8.1-11.8.3.

Suzuki, et al. "LPCVD-TiN Using Hydrazine and TiCl$_4$", VMIC Conference (Jun. 8-9, 1993), pp. 418-423.

Visokay, et al. "Application of HfSiON as a gate dielectric material," Applied Physics Letter, American Institute of Physics, New York, US, vol. 80, No. 17, Apr. 29, 2002, pp. 3183-3185.

Wise, et al. "Diethyldiethoxysilane as a new precursor for SiO$_2$ growth on silicon," Mat. Res. Soc. Symp. Proc., vol. 334 (1994), pp. 37-43.

Yamaga, et al. "Atomic layer epitaxy of ZnS by a new gas supplying system in a low-pressure metalorganic vapor phase epitaxy," J. of Crystal Growth 117 (1992), pp. 152-155.

Yamaguchi, et al. "Atomic-layer chemical-vapor-deposition of silicon dioxide films with extremely low hydrogen content," Appl. Surf. Sci., vol. 130-132 (1998), pp. 202-207.

Yang, et al. "Atomic Layer Deposition of Tungsten Film from Wf$_6$/B$_2$H$_6$: Nucleation Layer for Advanced Semiconductor Device," Conference Proceedings ULSI XVII (2002) Materials Research Society, pp. 655-660.

* cited by examiner

FORMATION OF BORIDE BARRIER LAYERS USING CHEMISORPTION TECHNIQUES

CROSS-REFERENCE TO RELATED APPLICATIONS

This application is a continuation of U.S. Ser. No. 10/993,925, filed Nov. 19, 2004, and issued as U.S. Pat. No. 7,208,413, which is a continuation of U.S. Ser. No. 10/387,990, filed Mar. 13, 2003, issued as U.S. Pat. No. 6,831,004, which is a continuation of U.S. Ser. No. 09/604,943, filed Jun. 27, 2000, issued as U.S. Pat. No. 6,620,723, which are all herein incorporated in their entirety by reference.

BACKGROUND OF THE INVENTION

1. Field of the Invention

The present invention relates to the formation of boride barrier layers and, more particularly to boride barrier layers formed using chemisorption techniques.

2. Description of the Related Art

In the manufacture of integrated circuits, barrier layers are often used to inhibit the diffusion of metals and other impurities into regions underlying such barrier layers. These underlying regions may include transistor gates, capacitor dielectric, semiconductor substrates, metal lines, as well as many other structures that appear in integrated circuits.

For the current sub-micron (0.5 µm) generation of semiconductor devices, any microscopic reaction at an interface between interconnection layers can cause degradation of the resulting integrated circuits (e.g., increase the resistivity of the interconnection layers). Consequently, barrier layers have become a critical component for improving the reliability of interconnect metallization schemes.

Compounds of refractory metals such as, for example, nitrides, borides, and carbides have been suggested as diffusion barriers because of their chemical inertness and low resistivity (e.g., resistivity typically less than about 200 µΩ-cm). In particular, borides such as, for example, titanium diboride ($TiB_2$) have been suggested for use as a barrier material since layers formed thereof generally have low resistivity (e.g., resistivity less than about 150 µΩ-cm).

Boride barrier layers are typically formed using chemical vapor deposition (CVD) techniques. For example, titanium tetrachloride ($TiCl_4$) may be reacted with diborane ($B_2H_6$) to form titanium diboride using CVD. However, when Cl-based chemistries are used to form boride barrier layers, reliability problems can occur. In particular, boride layers formed using CVD chlorine-based chemistries typically have a high chlorine content (e.g., chlorine content greater than about 3%). A high chlorine content is undesirable because the chlorine may migrate from the boride barrier layer into adjacent interconnection layers, which can increase the contact resistance of such interconnection layers and potentially change the characteristics of integrated circuits made therefrom.

Therefore, a need exists in the art for reliable boride barrier layers for integrated circuit fabrication. Particularly desirable would be reliable boride barrier layers useful for interconnect structures.

SUMMARY OF THE INVENTION

Boride barrier layers for integrated circuit fabrication are provided. In one embodiment, the boride barrier layer comprises one refractory metal. The boride barrier layer may be formed by sequentially chemisorbing alternating monolayers of a boron compound and a refractory metal compound onto a substrate.

In an alternate embodiment, a composite boride barrier layer is formed. The composite boride barrier layer comprises two or more refractory metals. The composite boride barrier layer may be formed by sequentially chemisorbing monolayers of a boron compound and two or more refractory metal compounds onto a substrate.

The boride barrier layer is compatible with integrated circuit fabrication processes. In one integrated circuit fabrication process, the boride barrier layer comprises one refractory metal. The boride barrier layer is formed by sequentially chemisorbing alternating monolayers of a boron compound and one refractory metal compound on a substrate. Thereafter, one or more metal layers are deposited on the boride barrier layer to form an interconnect structure.

In another integrated circuit fabrication process, the boride barrier layer has a composite structure. The composite boride barrier layer comprises two or more refractory metals. The composite boride barrier layer is formed by sequentially chemisorbing monolayers of a boron compound and two or more refractory metal compounds on a substrate. Thereafter, one or more metal layers are deposited on the composite boride barrier layer to form an interconnect structure.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
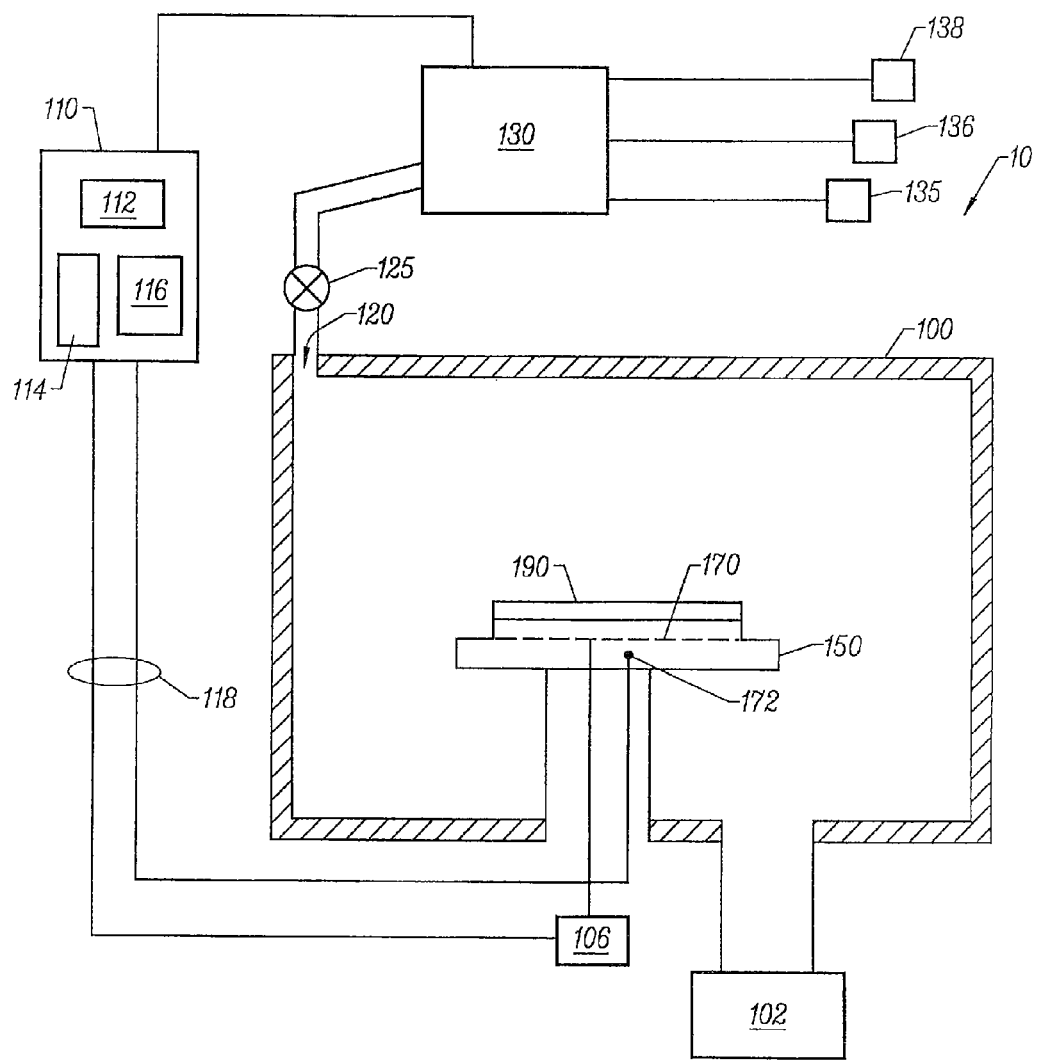
FIG. 1 depicts a schematic illustration of an apparatus that can be used for the practice of embodiments described herein.

FIG. 1 depicts a schematic illustration of a wafer processing system 10 that can be used to form boride barrier layers in accordance with embodiments described herein. The system 10 comprises a process chamber 100, a gas panel 130, a control unit 110, along with other hardware components such as power supplies 106 and vacuum pumps 102. The salient features of process chamber 100 are briefly described below.

Chamber 100

The process chamber 100 generally houses a support pedestal 150, which is used to support a substrate such as a semiconductor wafer 190 within the process chamber 100.

Depending on the specific process, the semiconductor wafer 190 can be heated to some desired temperature prior to layer formation.

In chamber 100, the wafer support pedestal 150 is heated by an embedded heater 170. For example, the pedestal 150 may be resistively heated by applying an electric current from an AC power supply 106 to the heater element 170. The wafer 190 is, in turn, heated by the pedestal 150, and can be maintained within a desired process temperature range of, for example, about 20° C. to about 500° C.

A temperature sensor 172, such as a thermocouple, is also embedded in the wafer support pedestal 150 to monitor the temperature of the pedestal 150 in a conventional manner. For example, the measured temperature may be used in a feedback loop to control the electric current applied to the heater element 170 by the power supply 106, such that the wafer temperature can be maintained or controlled at a desired temperature that is suitable for the particular process application. The pedestal 150 is optionally heated using radiant heat (not shown).

A vacuum pump 102 is used to evacuate process gases from the process chamber 100 and to help maintain the desired pressure inside the chamber 100. An orifice 120 is used to introduce process gases into the process chamber 100. The dimensions of the orifice 120 are variable and typically depend on the size of the process chamber 100.

The orifice 120 is coupled to a gas panel 130 via a valve 125. The gas panel 130 provides process gases from two or more gas sources 135, 136 to the process chamber 100 through orifice 120 and valve 125. The gas panel 130 also provides a purge gas from a purge gas source 138 to the process chamber 100 through orifice 120 and valve 125.

A control unit 110, such as a computer, controls the flow of various process gases through the gas panel 130 as well as valve 125 during the different steps of a wafer process sequence. Illustratively, the control unit 110 comprises a central processing unit (CPU) 112, support circuitry 114, and memories containing associated control software 116. In addition to the control of process gases through the gas panel 130, the control unit 110 is also responsible for automated control of the numerous steps required for wafer processing—such as wafer transport, temperature control, chamber evacuation, among other steps.

The control unit 110 may be one of any form of general purpose computer processor that can be used in an industrial setting for controlling various chambers and sub-processors. The computer processor may use any suitable memory, such as random access memory, read only memory, floppy disk drive, hard disk, or any other form of digital storage, local or remote. Various support circuits may be coupled to the computer processor for supporting the processor in a conventional manner. Software routines as required may be stored in the memory or executed by a second processor that is remotely located. Bi-directional communications between the control unit 110 and the various components of the wafer processing system 10 are handled through numerous signal cables collectively referred to as signal buses 118, some of which are illustrated in FIG. 1.

Boride Barrier Layer Formation

Figure 2A:
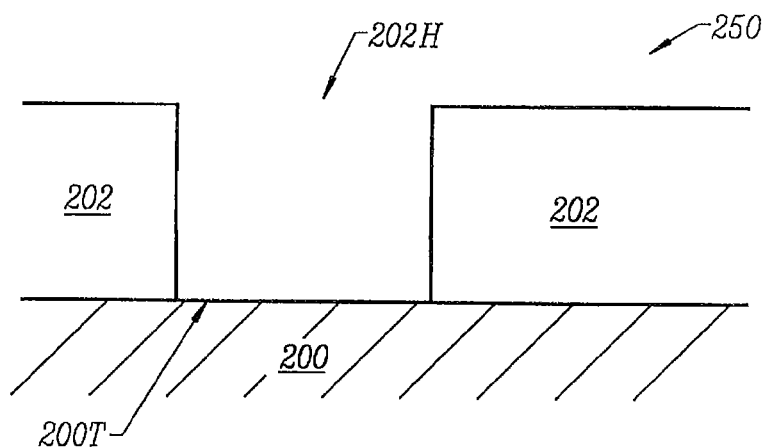
FIGS. 2A-2C depict cross-sectional views of a substrate structure at different stages of integrated circuit fabrication incorporating a boride barrier layer.
Figure 2B:
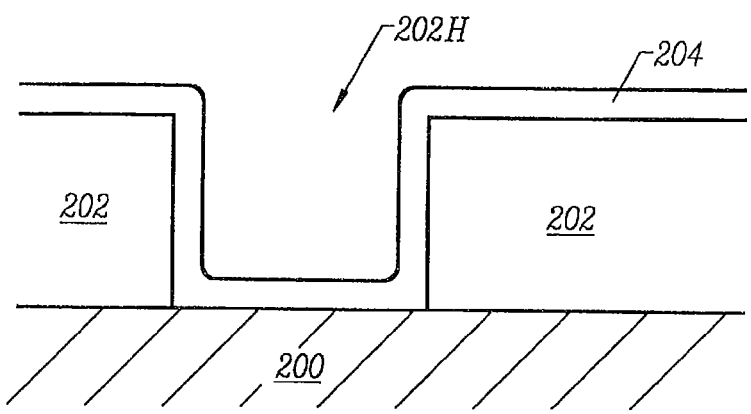
Figure 2C:
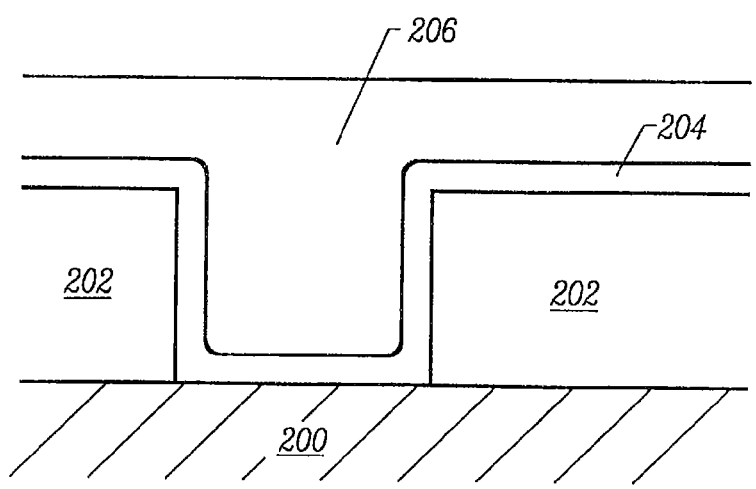

FIGS. 2A-2C illustrate one preferred embodiment of boride layer formation for integrated circuit fabrication of an interconnect structure. In general, the substrate 200 refers to any workpiece upon which film processing is performed, and a substrate structure 250 is used to generally denote the substrate 200 as well as other material layers formed on the substrate 200. Depending on the specific stage of processing, the substrate 200 may be a silicon semiconductor wafer, or other material layer, which has been formed on the wafer. FIG. 2A, for example, shows a cross-sectional view of a substrate structure 250, having a material layer 202 thereon. In this particular illustration, the material layer 202 may be an oxide (e.g., silicon dioxide). The material layer 202 has been conventionally formed and patterned to provide a contact hole 202H extending to the top surface 200T of the substrate 200.

FIG. 2B shows a boride layer 204 conformably formed on the substrate structure 250. The boride layer 204 is formed by chemisorbing monolayers of a boron-containing compound and a refractory metal compound on the substrate structure 250.

The monolayers are chemisorbed by sequentially providing a boron-containing compound and one or more refractory metal compounds to a process chamber. In a first sequential chemisorption process, the monolayers of the boron-containing compound and one refractory metal compound are alternately chemisorbed on a substrate 300 as shown in FIGS. 3A-3C.

Figure 3A:
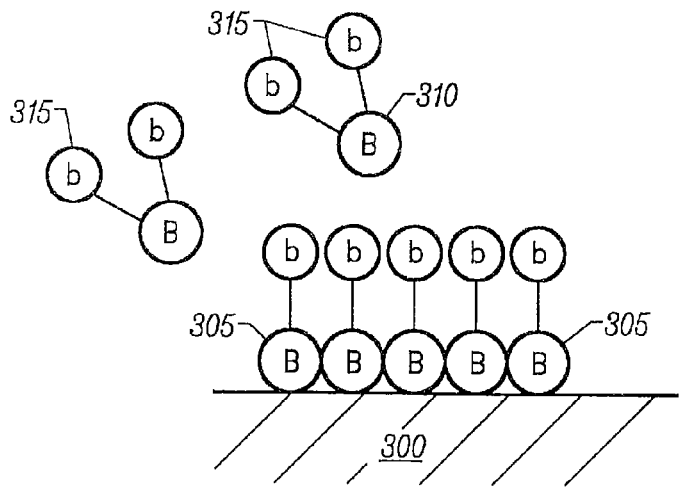
FIGS. 3A-3C depict cross-sectional views of a substrate undergoing a first sequential chemisorption process of a boron compound and one refractory metal compound to form a boride barrier layer.
Figure 3B:
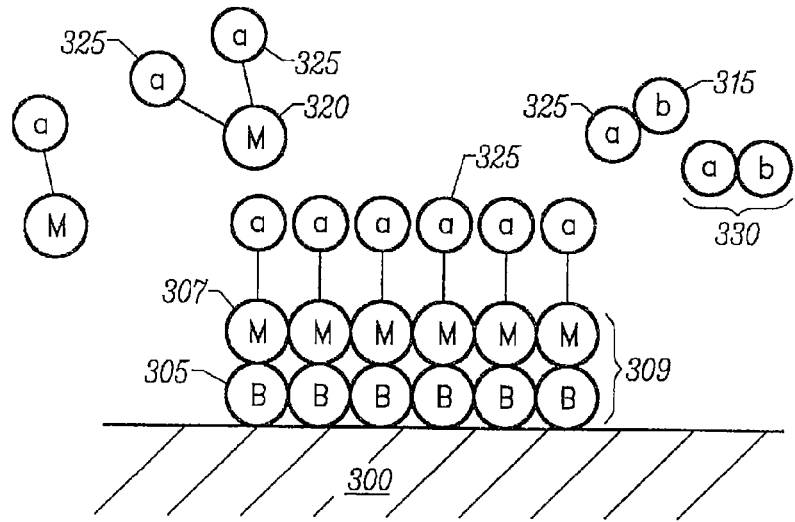
Figure 3C:
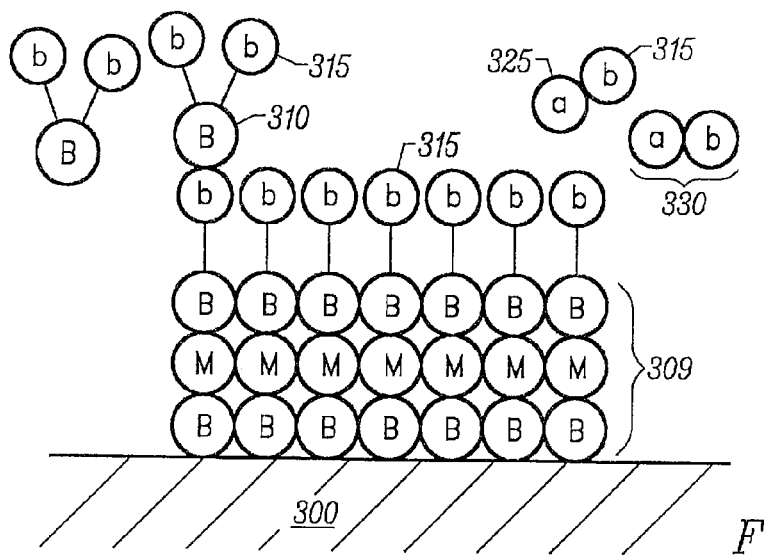

FIG. 3A depicts a cross-sectional view of a substrate 300, which may be in a stage of integrated circuit fabrication. A monolayer of a boron-containing compound 305 is chemisorbed on the substrate 300 by introducing a pulse of a boron-containing gas into a process chamber similar to that shown in FIG. 1. The boron-containing compound typically combines boron atoms 310 with one or more reactive species b 315. During boride layer formation, the reactive species b 315 form byproducts that are transported from the surface of substrate 300 by the vacuum system.

The chemisorbed monolayer of the boron-containing compound 305 is self-limiting in that only one monolayer may be chemisorbed onto the surface of substrate 300 during a given pulse. Only one monolayer of the boron-containing compound is chemisorbed on the substrate because the substrate has a limited surface area. This limited surface area provides a finite number of sites for chemisorbing the boron-containing compound. Once the finite number of sites is occupied by the boron-containing compound, further chemisorption of the boron-containing compound will be blocked.

The boron-containing compound may be for example a borane compound having the general formula $B_xH_y$, where x has a range between 1 and 10, and y has a range between 3 and 30. For example, borane ($BH_3$), diborane ($B_2H_6$), triborane, tetraborane, pentaborane, hexaborane, heptaborane, octaborane, nonaborane, and decaborane, may be used as the boron-containing compound.

After the monolayer of the boron compound is chemisorbed onto the substrate 300, excess boron-containing compound is removed from the process chamber by introducing a pulse of a purge gas thereto. Purge gases such as, for example, helium, argon, nitrogen ($N_2$), ammonia ($NH_3$), and hydrogen ($H_2$), among others may be used.

After the process chamber has been purged, a pulse of one refractory metal compound is introduced into the process chamber. Referring to FIG. 3B, a layer of the refractory metal compound 307 is chemisorbed on the boron monolayer 305. The refractory metal compound typically combines refractory metal atoms 320 with one or more reactive species a 325.

The chemisorbed monolayer of the refractory metal compound 307 reacts with the boron-containing monolayer 305 to form a boride layer 309. The reactive species a 325 and b 315 form byproducts ab 330 that are transported from the substrate 300 surface by the vacuum system. The reaction of the refractory metal compound 307 with the boron monolayer 305 is self-limited, since only one monolayer of the boron compound was chemisorbed onto the substrate 300 surface.

The refractory metal compound may include refractory metals such as for example titanium, tungsten, tantalum, zirconium, hafnium, molybdenum, niobium, vanadium, and chromium, among others combined with reactive species such as, for example chlorine and fluorine. For example, titanium tetrachloride ($TiCl_4$), tungsten hexafluoride ($WF_6$), tantalum pentachloride ($TaCl_5$), zirconium tetrachloride ($ZrCl_4$), hafnium tetrachloride ($HfCl_4$), molybdenum pentachloride ($MoCl_5$), niobium pentachloride ($NbCl_5$), vanadium pentachloride ($VCl_5$), chromium tetrachloride ($CrCl_4$) may be used as the refractory metal compound.

After the monolayer of the refractory metal compound is chemisorbed onto the substrate 300, any excess refractory metal compound is removed from the process chamber by introducing another pulse of the purge gas therein. Thereafter, as shown in FIG. 3C, the boride layer deposition sequence of alternating monolayers of the boron-containing compound and the refractory metal compound are repeated until a desired boride layer thickness is achieved. The boride layer may, for example, have a thickness in a range of about 200 Å to about 5,000 Å, and more preferably, about 2,500 Å.

In FIGS. 3A-3C, boride layer formation is depicted as starting with the chemisorption of a boron-containing monolayer on the substrate followed by a monolayer of a refractory metal compound. Alternatively, the boride layer formation may start with the chemisorption of a monolayer of a refractory metal compound on the substrate followed by a monolayer of the boron-containing compound.

The pulse time for each pulse of the boron-containing compound, the one or more refractory metal compounds, and the purge gas is variable and depends on the volume capacity of the deposition chamber as well as the vacuum system coupled thereto. Similarly, the time between each pulse is also variable and depends on the volume capacity of the process chamber as well as the vacuum system coupled thereto.

In general, the alternating monolayers may be chemisorbed at a substrate temperature less than about 500° C., and a chamber pressure less than about 100 Torr. A pulse time of less than about 1 second for the boron-containing compound, and a pulse time of less than about 1 second for the refractory metal compounds are typically sufficient to chemisorb the alternating monolayers that comprise the boride layer on the substrate. A pulse time of less than about 1 second for the purge gas is typically sufficient to remove the reaction byproducts as well as any residual materials remaining in the process chamber.

Figure 4A:
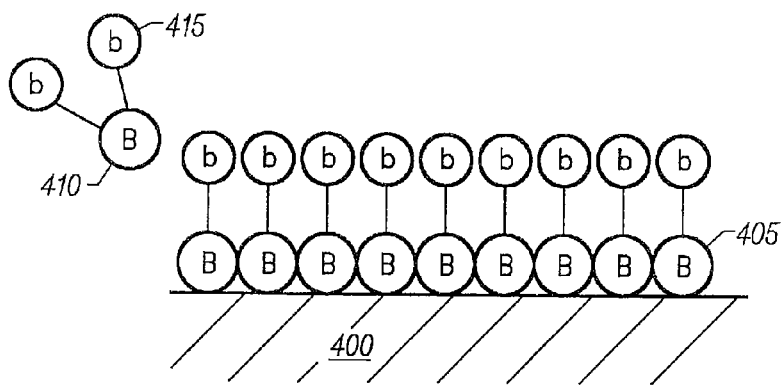
FIGS. 4A-4D depict cross-sectional views of a substrate undergoing a second sequential chemisorption process of a boron compound and two refractory metal compounds to form a composite boride barrier layer.

In a second chemisorption process, the boron-containing monolayers and two or more refractory metal compounds are alternately chemisorbed on the substrate to form a composite boride layer. FIG. 4A depicts a cross-sectional view of a substrate 400, which may be in a stage of integrated circuit fabrication. A self-limiting monolayer of a boron-containing compound 405 is chemisorbed on the substrate 400 by introducing a pulse of a boron-containing compound into a process chamber similar to that shown in FIG. 1 according to the process conditions described above with reference to FIGS. 2A-2C. The boron-containing compound combines boron atoms 410 with one or more reactive species b 415.

After the monolayer of the boron compound 405 is chemisorbed onto the substrate 400, excess boron-containing compound is removed from the process chamber by introducing a pulse of a purge gas thereto.

Figure 4B:
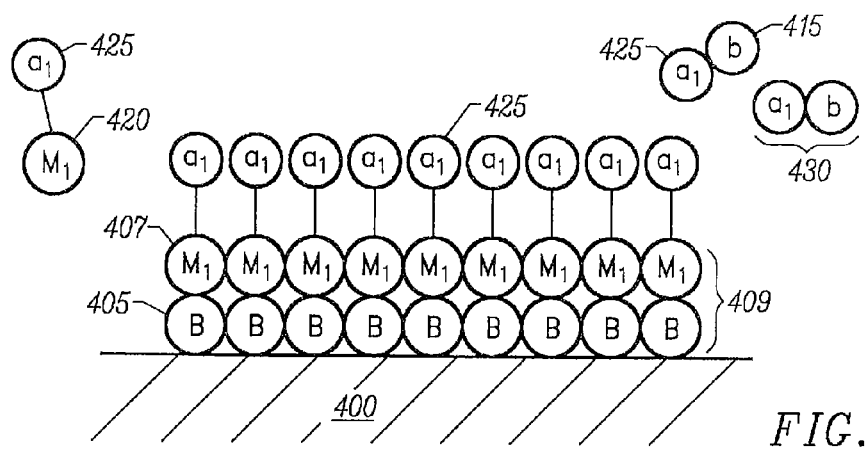

Referring to FIG. 4B, after the process chamber has been purged, a pulse of a first refractory metal compound $M_1a_1$ is introduced into the process chamber. A layer of the first refractory metal compound 407 is chemisorbed on the boron monolayer 405. The first refractory metal compound typically combines first refractory metal atoms $M_1$ 420 with one or more reactive species $a_1$ 425.

The chemisorbed monolayer of the first refractory metal compound 407 reacts with the boron-containing monolayer 405 to form a boride monolayer 409. The reactive species $a_1$ 425 and b 415 form byproducts $a_1b$ 430 that are transported from the substrate 400 surface by the vacuum system.

After the monolayer of the first refractory metal compound 407 is chemisorbed onto the substrate 400, the excess first refractory metal compound $M_1a_1$ is removed from the process chamber by introducing another pulse of the purge gas therein.

Figure 4C:
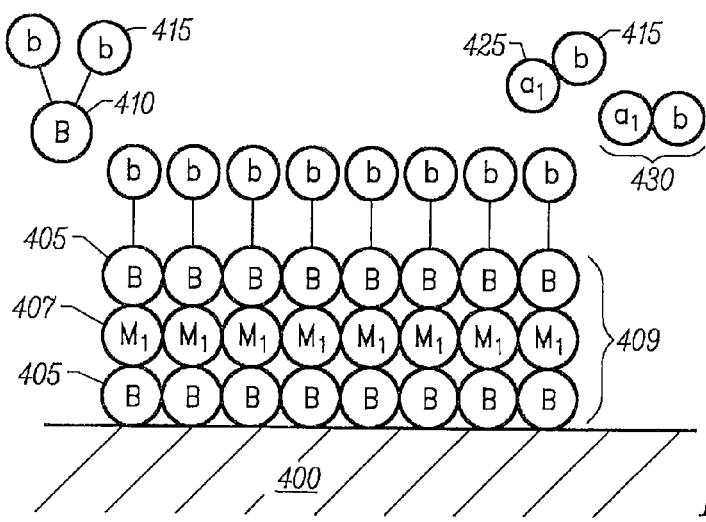

Another pulse of the boron-containing compound is than introduced into the process chamber. A monolayer of the boron-containing compound 405 is chemisorbed on the first refractory metal monolayer 407, as shown in FIG. 4C. The chemisorbed monolayer of the boron-containing compound 405 reacts with the first refractory metal monolayer 407 to form a boride layer 409. The reactive species $a_1$ 425 and b 415 form byproducts $a_1b$ 430 that are transported from the substrate 400 surface by the vacuum system.

After the monolayer of the boron compound 405 is chemisorbed onto the first refractive metal monolayer 407, excess boron-containing compound is removed from the process chamber by introducing a pulse of a purge gas thereto.

Figure 4D:
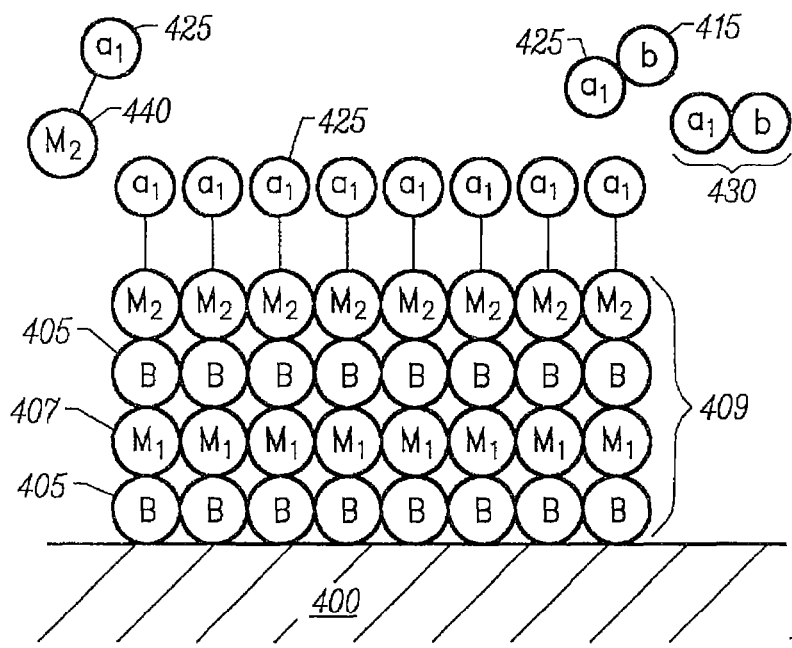

Referring to FIG. 4D, after the process chamber has been purged, a pulse of a second refractory metal compound $M_2a_1$ is introduced into the process chamber. A layer of the second refractory metal compound is chemisorbed on the boron monolayer 405. The second refractory metal compound typically combines second refractory metal atoms $M_2$ 440 with one or more reactive species $a_1$ 425.

The chemisorbed monolayer of the second refractory metal compound reacts with the boron-containing monolayer 405 to form the composite boride layer 409. The reactive species $a_1$ 425 and b 415 form byproducts $a_1b$ 430 that are transported from the substrate 400 surface by the vacuum system.

After the monolayer of the second refractory metal compound is chemisorbed onto the substrate 400, the excess second refractory metal compound $M_2a_1$ is removed from the process chamber by introducing another pulse of the purge gas therein.

Thereafter, the boride layer deposition sequence of alternating monolayers of the boron-containing compound and the two refractory metal compounds $M_1a_1$ and $M_2a_1$ are repeated until a desired boride layer thickness is achieved.

In FIGS. 4A-4D, boride layer formation is depicted as starting with the chemisorption of the boron-containing monolayer on the substrate followed by monolayers of the two refractory metal compounds. Alternatively, the boride layer formation may start with the chemisorption of monolayers of either of the two refractory metal compounds on the substrate followed by monolayers of the boron-containing compound. Optionally, monolayers of more than two refractory metal compounds may be chemisorbed on the substrate 400.

In a third chemisorption process, the boron-containing monolayers and two or more refractory metal compounds are alternately chemisorbed on the substrate to form a composite boride layer, as illustrated in FIGS. 5A-5D.

Figure 5A:
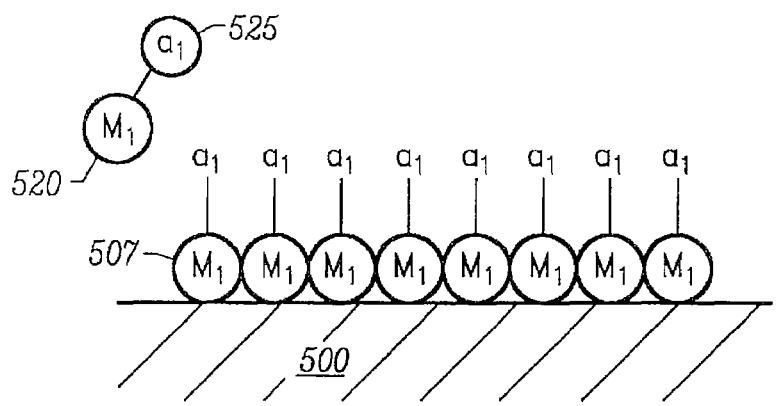
FIGS. 5A-5D depict cross-sectional views of a substrate undergoing a third sequential chemisorption of a boron compound and two refractory metal compounds to form a composite boride barrier layer.

FIG. 5A depicts a cross-sectional view of a substrate 500, which may be in a stage of integrated circuit fabrication. A self-limiting monolayer of a first refractory metal compound 507 is chemisorbed on the substrate 500 by introducing a pulse of a first refractory metal compound $M_1a_1$ into a process chamber similar to that shown in FIG. 1 according to the process conditions described above with reference to FIGS. 2A-2C.

After the monolayer of the first refractory metal compound 507 is chemisorbed onto the substrate 500, excess first refractory metal compound is removed from the process chamber by introducing a pulse of a purge gas thereto.

Figure 5B:
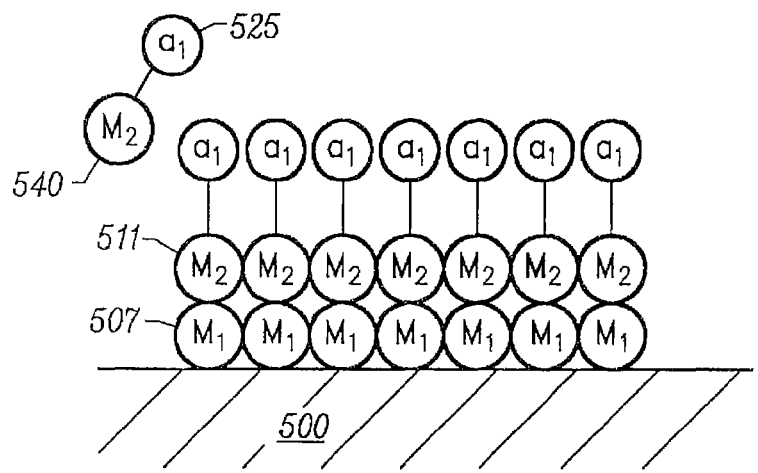

Referring to FIG. 5B, after the process chamber has been purged, a pulse of a second refractory metal compound $M_2a_1$ is introduced into the process chamber. A layer of the second refractory metal compound 511 is chemisorbed on the first refractory metal monolayer 507.

After the monolayer of the second refractory metal compound 511 is chemisorbed onto the substrate 500, the excess second refractory metal compound $M_2a_1$ is removed from the process chamber by introducing another pulse of the purge gas therein.

Figure 5C:
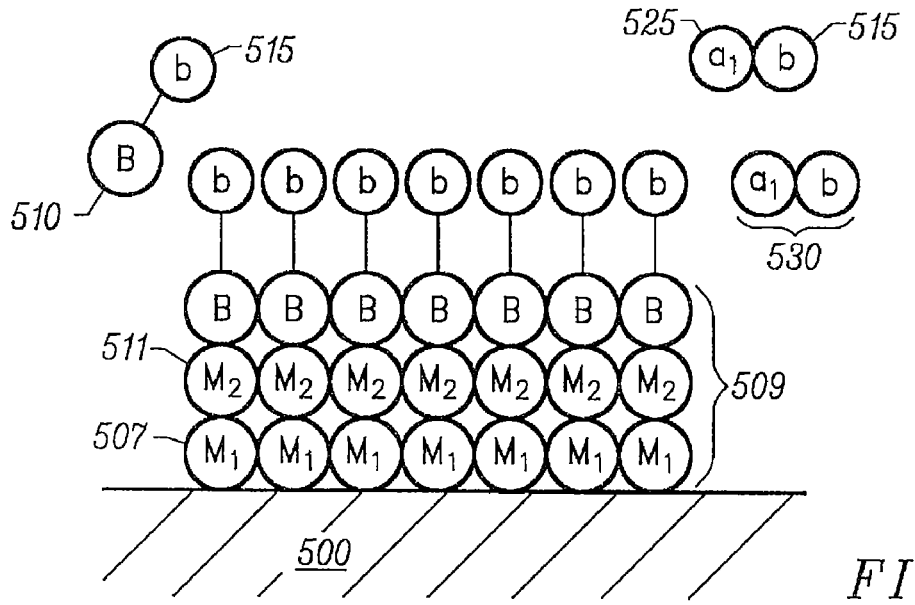

A pulse of a boron-containing compound 510 is than introduced into the process chamber. A monolayer of the boron-containing compound 505 is chemisorbed on the second refractory metal monolayer 511, as shown in FIG. 5C. The chemisorbed monolayer of the boron-containing compound 505 reacts with the second refractory metal monolayer 511 to form a composite boride layer 509. The reactive species $a_1$ 525 and b 515 form byproducts $a_1b$ 530 that are transported from the substrate 500 surface by the vacuum system.

After the monolayer of the boron compound 505 is chemisorbed onto the second refractory metal monolayer 511, excess boron-containing compound is removed from the process chamber by introducing a pulse of a purge gas thereto.

Figure 5D:
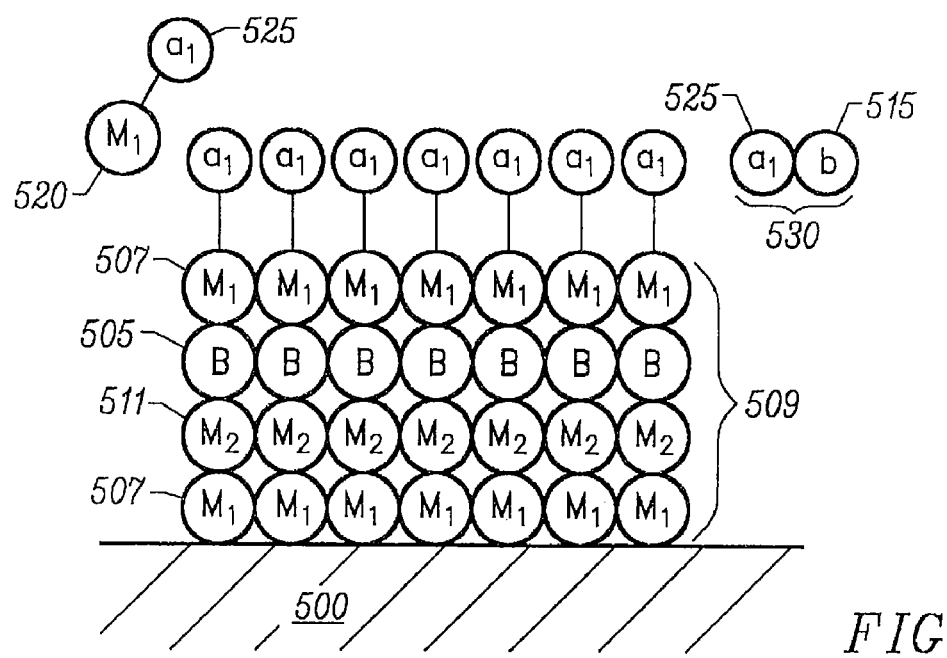

Referring to FIG. 5D, after the process chamber has been purged, a pulse of the first refractory metal compound 520 $M_1a_1$ is introduced into the process chamber. A monolayer of the first refractory metal compound 507 is chemisorbed on the boron monolayer 505.

The chemisorbed monolayer of the first refractory metal compound 507 reacts with the boron-containing monolayer 505 to form the boride monolayer 509. The reactive species $a_1$ 525 and b 515 form byproducts $a_1b$ 530 that are transported from the substrate 500 surface by the vacuum system.

After the monolayer of the first refractory metal compound 507 is chemisorbed onto the substrate 500, the excess first refractory metal compound $M_1a_1$ is removed from the process chamber by introducing another pulse of the purge gas therein.

Thereafter, the boride layer deposition sequence of alternating monolayers of the boron-containing compound and the two refractory metal compounds $M_1a_1$ (520) and $M_2a_1$ (540) are repeated until a desired boride layer thickness is achieved.

In FIGS. 5A-5D, boride layer formation is depicted as starting with the chemisorption of the first refractory metal monolayer on the substrate followed by monolayers of the second refractory metal compound and the boron-containing compound. Alternatively, the boride layer formation may start with the chemisorption of the monolayer of the boron-containing compound on the substrate followed by the monolayers of the two refractory metal compounds. Optionally, monolayers of more than two refractory metal compounds may be chemisorbed on the substrate 500.

The sequential deposition processes described above advantageously provide good step coverage for the boride layer, due to the monolayer chemisorption mechanism used for forming the boride layer. In particular, boride layer formation using the monolayer chemisorption mechanism is believed to contribute to a near perfect step coverage over complex substrate topographies.

Furthermore, in chemisorption processes, since only one monolayer may be absorbed on the topographic surface, the size of the deposition area is largely independent of the amount of precursor gas remaining in the reaction chamber once a monolayer has been formed.

Referring to FIG. 2C, after the formation of the boride layer 204, a contact layer 206 may be formed thereon to complete the interconnect structure. The contact layer 206 is preferably selected from the group of aluminum, copper, tungsten, and combinations thereof.

The contact layer 206 may be formed, for example, using chemical vapor deposition (CVD), physical vapor deposition (PVD), or a combination of both CVD and PVD. For example, an aluminum layer may be deposited from a reaction of a gas mixture containing dimethyl aluminum hydride (DMAH) and hydrogen ($H_2$) or argon or other DMAH containing compounds, a CVD copper layer may be deposited from a gas mixture containing $Cu^{+2}(hfac)_2$ (copper hexafluoro acetylacetonate), $Cu^{+2}(fod)_2$ (copper heptafluoro dimethyl octanediene), $Cu^{+1}(hfac)TMVS$ (copper hexafluoro acetylacetonate trimethylvinylsilane), or combinations thereof, and a CVD tungsten layer may be deposited from a gas mixture containing tungsten hexafluoride. A PVD layer is deposited from a copper target, an aluminum target, or a tungsten target.

Figure 6A:
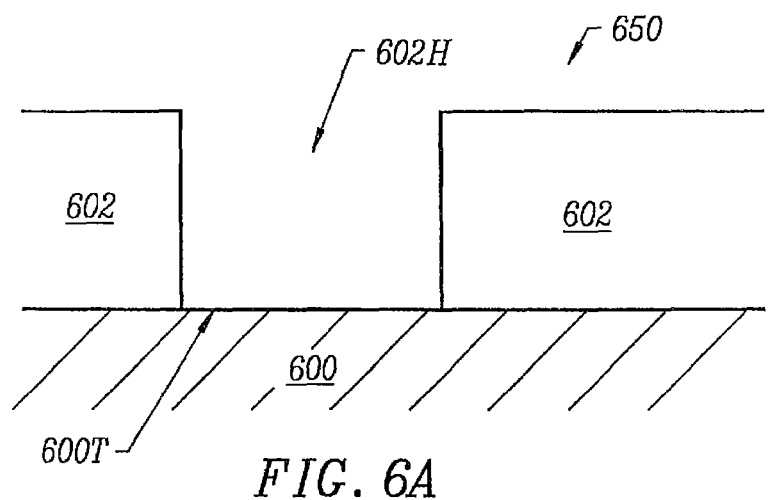
FIGS. 6A-6C depict cross-sectional views of a substrate structure at different stages of integrated circuit fabrication incorporating more than one boride barrier layer.
Figure 6B:
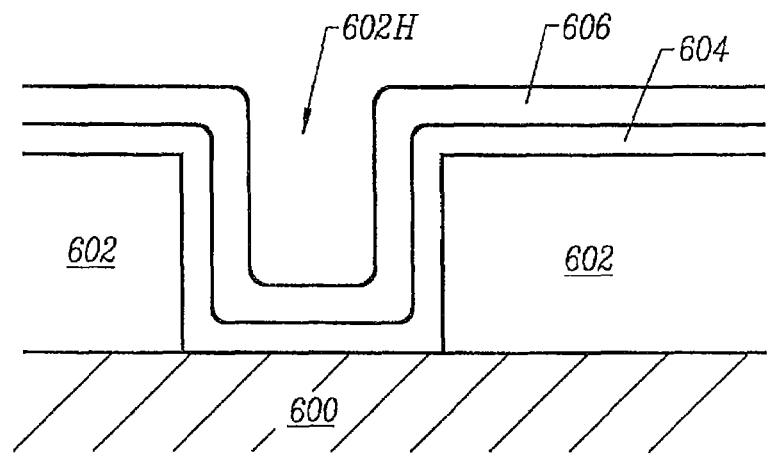
Figure 6C:
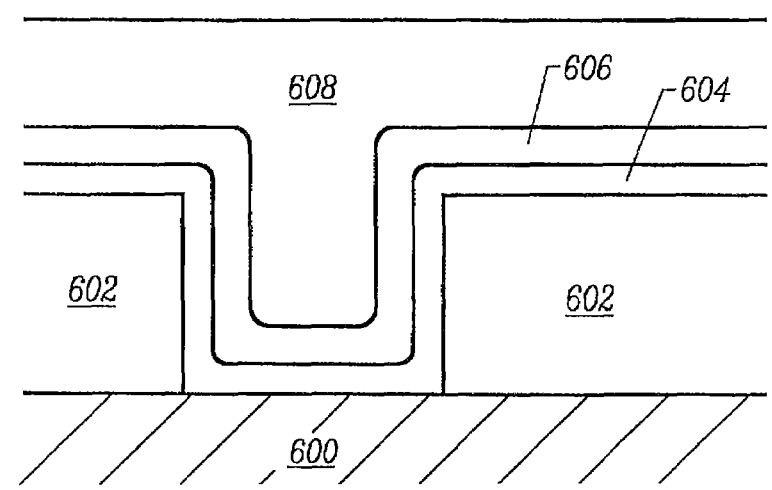

FIGS. 6A-6C illustrate an alternate embodiment of boride layer formation for integrated circuit fabrication of the interconnect structure. In general, the substrate 600 refers to any workpiece upon which film processing is performed, and a substrate structure 650 is used to generally denote the substrate 600 as well as other material layers formed on the substrate 600. Depending on the specific stage of processing, the substrate 600 may be a silicon semiconductor wafer, or other material layer, which has been formed on the wafer. FIG. 6A, for example, shows a cross-sectional view of a substrate structure 650, having a material layer 602 thereon. In this particular illustration, the material layer 602 may be an oxide (e.g., silicon dioxide). The material layer 602 has been conventionally formed and patterned to provide a contact hole 602H extending to the top surface 600T of the substrate 600.

FIG. 6B shows two boride layers 604, 606 conformably formed on the substrate structure 650. The boride layers 604, 606 are formed by chemisorbing monolayers of a boron-containing compound and one or more refractory metal compounds on the substrate structure 650 as described above with reference to FIGS. 3a-5d. The two boride layers 604, 606 may each comprise one or more refractory metals. The thicknesses of the two or more boride layers 604, 606 may be variable depending on the specific stage of processing. Each boride layer 604, 606 may, for example, have a thickness in a range of about 200 Å to about 5,000 Å.

Referring to FIG. 6C, after the formation of the boride layers 604, 606, a contact layer 608 may be formed thereon to complete the interconnect structure. The contact layer 608 is preferably selected from the group of aluminum, copper, tungsten, and combinations thereof.

The specific process conditions disclosed in the above discussion are meant for illustrative purposes only. Other combinations of process parameters such as precursor and inert gases, flow ranges, pressure and temperature may also be used in forming the boride layer of the present invention.

Although several preferred embodiments, which incorporate the teachings of the present invention, have been shown and described in detail, those skilled in the art can readily devise many other varied embodiments that still incorporate these teachings.

The invention claimed is:

1. A method for depositing a boride-containing barrier layer on a substrate, comprising:
exposing a substrate sequentially and cyclically to a boron-containing compound, a purge gas, and a tungsten precursor to form a first boride-containing layer comprising tungsten and boron during a first sequential chemisorption process; and
exposing the substrate sequentially and cyclically to the boron-containing compound, an ammonia purge gas, and the tungsten precursor to form a second boride-containing layer over the first boride-containing layer during a second sequential chemisorption process.

2. The method of claim 1, wherein the second sequential chemisorption process comprises:
exposing the substrate to the boron-containing compound;
exposing the substrate to the ammonia purge gas;
exposing the substrate to the tungsten precursor; and
exposing the substrate to the ammonia purge gas.

3. The method of claim 1, wherein the second sequential chemisorption process comprises:
exposing the substrate to the boron-containing compound;
exposing the substrate to the ammonia purge gas; and
exposing the substrate to the tungsten precursor.

4. The method of claim 1, wherein the tungsten precursor comprises tungsten hexafluoride.

5. The method of claim 4, wherein the boron-containing compound comprises diborane.

6. The method of claim 5, wherein a contact layer is deposited over the second boride-containing layer.

7. The method of claim 6, wherein the contact layer comprises tungsten and the contact layer is deposited by a chemical vapor deposition process.

8. The method of claim 6, wherein the contact layer comprises copper and the contact layer is deposited by a physical vapor deposition process.

9. The method of claim 1, wherein the first boride-containing layer or the second boride-containing layer is formed at a temperature of less than about 500° C.

10. The method of claim 9, wherein the temperature is about 400° C. or less.

11. A method for depositing a boride-containing barrier layer on a substrate, comprising:
exposing a substrate sequentially and cyclically to a boron-containing compound, an ammonia purge gas, and a tungsten precursor to form a first boride-containing layer during a first sequential chemisorption process; and
exposing the substrate sequentially and cyclically to the boron-containing compound, a purge gas, and the tungsten precursor to form a second boride-containing layer over the first boride-containing layer during a second sequential chemisorption process.

12. The method of claim 11, wherein the first sequential chemisorption process comprises:
exposing the substrate to the boron-containing compound;
exposing the substrate to the ammonia purge gas;
exposing the substrate to the tungsten precursor; and
exposing the substrate to the ammonia purge gas.

13. The method of claim 11, wherein the first sequential chemisorption process comprises:
exposing the substrate to the boron-containing compound;
exposing the substrate to the ammonia purge gas; and
exposing the substrate to the tungsten precursor.

14. The method of claim 11, wherein the tungsten precursor comprises tungsten hexafluoride.

15. The method of claim 14, wherein the boron-containing compound comprises diborane.

16. The method of claim 15, wherein a contact layer is deposited over the second boride-containing layer.

17. The method of claim 16, wherein the contact layer comprises tungsten and the contact layer is deposited by a chemical vapor deposition process.

18. The method of claim 16, wherein the contact layer comprises copper and the contact layer is deposited by a physical vapor deposition process.

19. The method of claim 11, wherein the first boride-containing layer or the second boride-containing layer is formed at a temperature of less than about 500° C.

20. The method of claim 19, wherein the temperature is about 400° C. or less.

21. A method for depositing a boride-containing barrier layer on a substrate, comprising:
exposing a substrate sequentially to diborane, a purge gas comprising helium, argon, and hydrogen, and tungsten hexafluoride to form a first boride-containing layer comprising tungsten and boron during a first sequential chemisorption process; and
exposing the substrate to the diborane, ammonia purge gas, and the tungsten hexafluoride to form a second boride-containing layer over the first boride-containing layer during a second sequential chemisorption process.

* * * * *

UNITED STATES PATENT AND TRADEMARK OFFICE
CERTIFICATE OF CORRECTION

PATENT NO.         : 7,501,344 B2
APPLICATION NO.    : 11/739549
DATED              : March 10, 2009
INVENTOR(S)        : Byun et al.

It is certified that error appears in the above-identified patent and that said Letters Patent is hereby corrected as shown below:

On The Title Page Item (56):

Please insert --6,026,967 A 2/2000 Isaacs et al.--;

Please delete "6,647,138 B1 11/2003 Sakaguchi" and insert --6,674,138 B1 1/2004 Halliyal et al.-- therefor.

Signed and Sealed this

Twenty-sixth Day of May, 2009

JOHN DOLL
*Acting Director of the United States Patent and Trademark Office*